US011038096B2

(12) United States Patent
Modi et al.

(10) Patent No.: US 11,038,096 B2
(45) Date of Patent: Jun. 15, 2021

(54) STACK ASSEMBLY HAVING ELECTRO-ACOUSTIC DEVICE

(71) Applicant: SKYWORKS SOLUTIONS, INC., Woburn, MA (US)

(72) Inventors: Hardik Bhupendra Modi, Irvine, CA (US); Adarsh Karan Jaiswal, Santa Ana, CA (US); Anil K. Agarwal, Ladera Ranch, CA (US); Engin Ibrahim Pehlivanoglu, Costa Mesa, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/160,042

(22) Filed: Oct. 15, 2018

(65) Prior Publication Data

US 2019/0115309 A1 Apr. 18, 2019

Related U.S. Application Data

(60) Provisional application No. 62/572,511, filed on Oct. 15, 2017.

(51) Int. Cl.
*H01L 41/311* (2013.01)
*H01L 23/552* (2006.01)
(Continued)

(52) U.S. Cl.
CPC ............ *H01L 41/311* (2013.01); *G01S 19/21* (2013.01); *H01L 23/552* (2013.01); *H01L 23/66* (2013.01);
(Continued)

(58) Field of Classification Search
CPC ............... H01L 25/0657; H01L 25/105; H01L 2225/0651; H01L 2225/06517;
(Continued)

(56) References Cited

U.S. PATENT DOCUMENTS

2005/0212078 A1 9/2005 Kwon et al.
2012/0299170 A1* 11/2012 Kehrer ................ H01L 23/3107 257/673
2013/0122833 A1 5/2013 Hadjichristos et al.

FOREIGN PATENT DOCUMENTS

JP 2006-121147 A 5/2006
KR 10-2012-0051407 A 5/2012
KR 101207433 B1 * 12/2012

OTHER PUBLICATIONS

International Search Report dated Feb. 25, 2019 for PCT/US2018/055818.
Written Opinion dated Feb. 25, 2019 for PCT/US2018/055818.

* cited by examiner

*Primary Examiner* — Robert G Bachner
*Assistant Examiner* — Molly K Reida
(74) *Attorney, Agent, or Firm* — Chang & Hale LLP

(57) ABSTRACT

Stack assembly having electro-acoustic device. In some embodiments, a radio-frequency (RF) module can include a packaging substrate configured to receive a plurality of components, and an electro-acoustic device mounted on the packaging substrate. The RF module can further include a die having an integrated circuit and mounted over the electro-acoustic device to form a stack assembly. The electro-acoustic device can be, for example, a filter device such as a surface acoustic wave filter. The die can be, for example an amplifier die such as a low-noise amplifier implemented on a silicon die.

15 Claims, 14 Drawing Sheets

(51) Int. Cl.
*H01L 23/66* (2006.01)
*G01S 19/21* (2010.01)
*H03F 3/195* (2006.01)
*H03H 9/02* (2006.01)
*H03H 9/64* (2006.01)

(52) U.S. Cl.
CPC ......... *H03F 3/195* (2013.01); *H03H 9/02976* (2013.01); *H03H 9/6406* (2013.01); *H01L 2223/6611* (2013.01); *H01L 2223/6644* (2013.01); *H01L 2223/6677* (2013.01); *H01L 2224/32145* (2013.01); *H01L 2224/48091* (2013.01); *H01L 2224/73204* (2013.01); *H01L 2224/73253* (2013.01); *H01L 2225/0651* (2013.01); *H01L 2225/06517* (2013.01); *H01L 2225/06537* (2013.01); *H01L 2924/15313* (2013.01); *H01L 2924/19042* (2013.01); *H01L 2924/19105* (2013.01); *H01L 2924/3025* (2013.01); *H03F 2200/294* (2013.01)

(58) Field of Classification Search
CPC . H01L 2225/06524; H01L 2225/06537; H01L 2225/06558; H01L 41/311; H01L 23/66; H01L 2224/32145; H01L 2223/6644; H03F 3/195; H03F 9/02976; H03H 9/0547
See application file for complete search history.

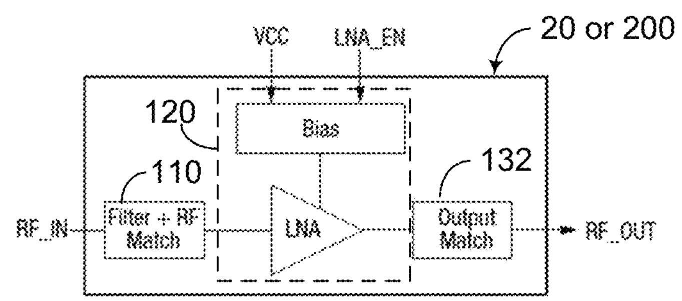
FIG. 6
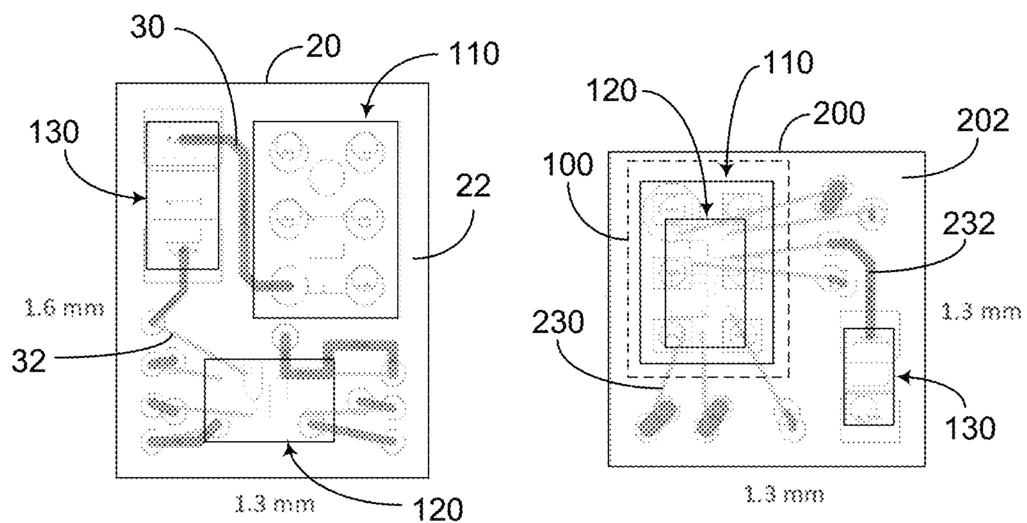
FIG. 7
FIG. 8

100
110
SAW
Die 1
Die 2
120a
120b 100
110
Die
SAW
120
121

100
120
110
Die
SAW

STACK ASSEMBLY HAVING ELECTRO-ACOUSTIC DEVICE

CROSS-REFERENCE TO RELATED APPLICATION(S)

This application claims priority to U.S. Provisional Application No. 62/572,511 filed Oct. 15, 2017, entitled STACK ASSEMBLY HAVING ELECTRO-ACOUSTIC DEVICE, the disclosure of which is hereby expressly incorporated by reference herein in its entirety.

BACKGROUND

Field

The present disclosure relates to a stack assembly having an electro-acoustic device.

Description of the Related Art

In radio-frequency (RF) applications, an electro-acoustic device can be utilized to process an RF signal in an acoustic realm. Such a device typically includes transducers configured to convert an electromagnetic energy of the RF signal to an acoustic energy, and to convert the acoustic energy back into an electromagnetic energy. While in the acoustic realm, the electro-acoustic device can be configured to provide a desirable functionality such as, for example, filtering functionality.

SUMMARY

According to a number of implementations, the present disclosure relates to a radio-frequency module that includes a packaging substrate configured to receive a plurality of components, and an electro-acoustic device mounted on the packaging substrate. The radio-frequency module further includes a die having a radio-frequency integrated circuit and mounted over the electro-acoustic device to form a stack assembly.

In some embodiments, the electro-acoustic device can be a filter such as a surface acoustic wave (SAW) filter. The radio-frequency integrated circuit can be configured to amplify a signal, and include an amplifier such as a low-noise amplifier. The die associated with such an amplifier can be, for example, a silicon die. In some embodiments, the radio-frequency module can be, for example, a global positioning system (GPS) module.

In some embodiments, the radio-frequency module can further include a mounting layer implemented between the electro-acoustic device and the die, and be configured to secure the die to the electro-acoustic device. Such a mounting layer can be, for example, a resin.

In some embodiments, the radio-frequency module can further include an overmold implemented over the packaging substrate to encapsulate the stack assembly. In some embodiments, the radio-frequency module can further include a conductive layer implemented on an upper surface of the overmold and side walls of the radio-frequency module to provide a shielding functionality.

In some embodiments, the electro-acoustic device can include a mounting side configured to allow the mounting of the electro-acoustic device on the packaging substrate. The mounting side of the electro-acoustic device include, for example, a plurality of solder balls.

In some embodiments, the die can be configured to allow formation of a plurality of wirebonds to provide respective electrical connections between the die and the packaging substrate. In some embodiments, the packaging substrate can have an area that is less than an area associated with another packaging substrate configured to receive the electro-acoustic device and the die in an unstacked manner.

In some teachings, the present disclosure relates to a method for fabricating a radio-frequency module. The method includes forming or providing a packaging substrate configured to receive a plurality of components, and mounting an electro-acoustic device on the packaging substrate. The method further includes mounting a die having a radio-frequency integrated circuit over the electro-acoustic device to form a stack assembly.

In some embodiments, the mounting of the die can include applying a mounting layer between the electro-acoustic device and the die.

In some embodiments, the method can further include forming an overmold over the packaging substrate to encapsulate the stack assembly. In some embodiments, at least some of the forming or providing of the packaging substrate, the mounting of the electro-acoustic device, the mounting of the die, and the forming of the overmold can be performed while in a panel format having an array of units, each unit corresponding to a radio-frequency module. In some embodiments, the method can further include singulating the array of units into a plurality of individual units. In some embodiments, the method can further include applying a conformal shield coating on upper surface and side walls of each of the plurality of individual units.

In some implementations, the present disclosure relates to a wireless device that includes an antenna configured to receive a signal, and a radio-frequency module configured to filter and amplify the signal. The radio-frequency module includes a packaging substrate and a filter mounted on the packaging substrate. The radio-frequency module further includes a low-noise amplifier die and mounted over the electro-acoustic device, such that the signal is filtered by the filter and amplified by the low-noise amplifier. The wireless device further includes a receiver configured to further process the amplified signal.

In some implementations, the present disclosure relates to an assembly of components for radio-frequency application. The assembly includes an electro-acoustic device and a die having a radio-frequency integrated circuit. The die is attached to the electro-acoustic device to form a stack, such that the assembly is capable of filtering and amplifying a signal.

In some embodiments, the electro-acoustic device can be a surface acoustic wave filter, and the die can be a low-noise amplifier die. The surface acoustic wave filter and the low-noise amplifier die can be configured to operate in a range of frequency associated with a global positioning system (GPS).

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 6 shows an example of an RF circuit that can be implemented in a module.

FIG. 7 shows an example layout of the architecture of FIG. 6, in which a SAW filter and a low-noise amplifier (LNA) die are arranged in a non-stack arrangement in a module, similar to the example of FIG. 2.

FIG. 8 shows an example layout of the architecture of FIG. 6, in which a SAW filter and low-noise amplifier (LNA) die are arranged in a stack arrangement in a module, similar to the example of FIG. 3.

DETAILED DESCRIPTION OF SOME EMBODIMENTS

The headings provided herein, if any, are for convenience only and do not necessarily affect the scope or meaning of the claimed invention.

Figure 1:
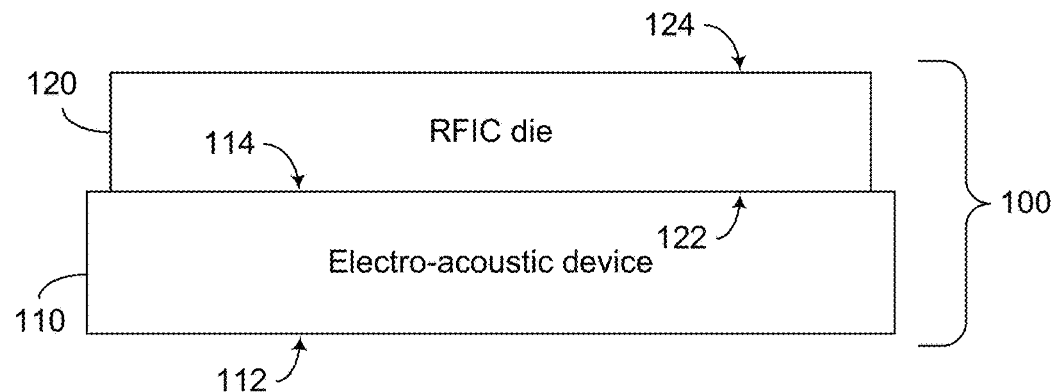
FIG. 1 shows a stack assembly that includes an electro-acoustic device and a semiconductor die having a radio-frequency (RF) integrated circuit (RFIC).

Described herein are various examples of circuits, devices and methods related to a stack assembly that includes an electro-acoustic device. FIG. 1 shows a stack assembly 100 (also referred to herein as simply a stack) that includes an electro-acoustic device 110 and a semiconductor die 120 having a radio-frequency (RF) integrated circuit (RFIC). More specific examples of the electro-acoustic device 110 and the semiconductor die 120 are described herein in greater detail.

In some embodiments, the electro-acoustic device 110 can include a first surface or side 112 configured to allow mounting of the electro-acoustic device 110 onto a circuit board. In some embodiments, such a mounting side of the electro-acoustic device 110 can be utilized to mount the stack 100 itself to onto the circuit board.

In the example of FIG. 1, the electro-acoustic device 110 can further include a second surface or side 114, and the RFIC die 120 can be mounted over such a surface. Examples of how such stacking of the RFIC die 120 over the electro-acoustic device 110 to form the stack 100 are described herein in greater detail.

In the example of FIG. 1, the RFIC die 120 can include a first surface or side 122 configured to allow mounting of the RFIC die 120 onto a circuit board. However, instead of being mounted onto the circuit board, the first side 122 can be utilized to mount the RFIC die 120 over the second surface 114 of the electro-acoustic device 110.

In the example of FIG. 1, the RFIC die 120 can further include a second surface or side 124 configured to provide electrical connections (e.g., connections for power, control, signal and ground associated with the RFIC on the die). Examples of how such electrical connections can be made when the RFIC die 120 is in the stack 100 are described herein in greater detail.

In some embodiments, such as the example of FIG. 1, each of the electro-acoustic device 110 and the RFIC die 120 can be configured to be capable of being mounted directly on a circuit board such as a packaging substrate. Accordingly, FIGS. 2 and 3 show a comparison between a layout of a module 20 (FIG. 2) having an electro-acoustic device 110 and an RFIC die 120 arranged in an non-stack manner, and a layout of a module 200 (FIG. 3) having an electro-acoustic device 110 and an RFIC die 120 arranged in stack manner.

Figure 2:
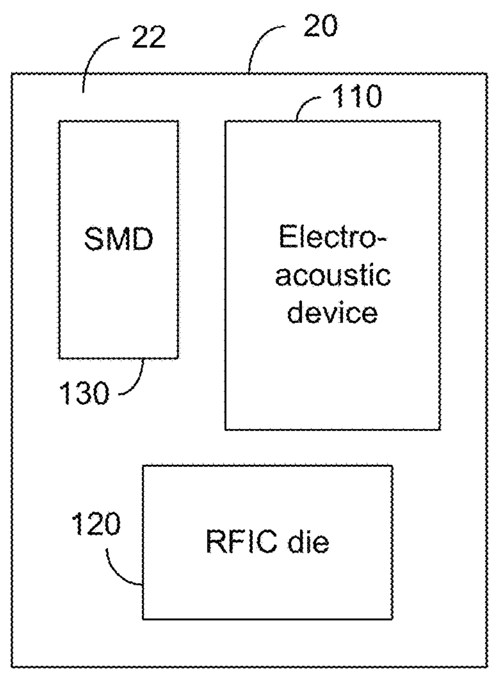
FIG. 2 shows an example layout of a module having an electro-acoustic device and an RFIC die arranged in a non-stack manner.

More particularly, and referring to FIG. 2, the module 20 is shown to include a packaging substrate 22; and an electro-acoustic device 110, an RFIC die 120, and a surface-mount device (SMD) 130 are shown to be mounted directly on the packaging substrate 22. Accordingly, each of the three foregoing components is shown to occupy a corresponding area on the packaging substrate 22.

Figure 3:
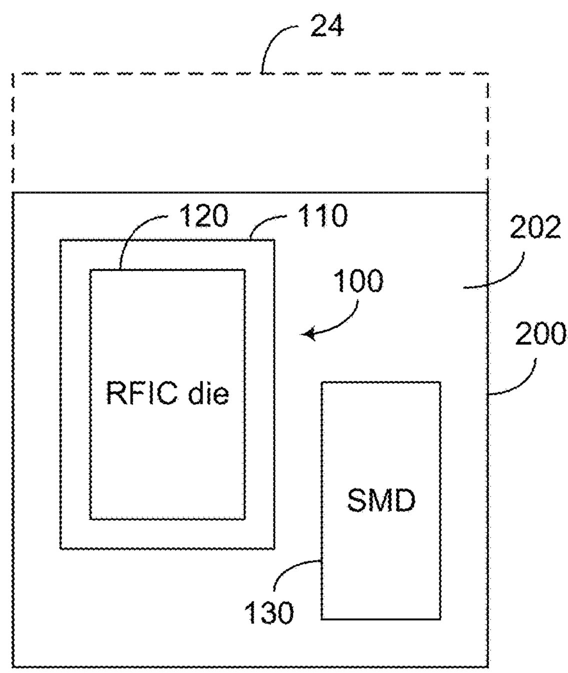
FIG. 3 shows an example layout of a module having an electro-acoustic device and an RFIC die arranged in stack manner.

In the example of FIG. 3, the module 200 is shown to include a packaging substrate 202; and an electro-acoustic device 110, an RFIC die 120, and a surface-mount device (SMD) 130 are shown to be mounted over the packaging substrate 202. However, the RFIC die 120 being stacked over the electro-acoustic device 110 (to yield a stack 100) results in the stack 100 and the SMD 130 occupying corresponding areas on the packaging substrate 202.

In the example of FIG. 3, suppose that the electro-acoustic device 110 has a larger footprint area than that of the RFIC die 120, and that the footprint of the RFIC die 120 is within the footprint of the electro-acoustic device 110 when in the stack configuration. In such a configuration, the footprint area occupied by the electro-acoustic device 110 and the RFIC die 120 is approximately the footprint area of the electro-acoustic device 110. Thus, a significant reduction in required footprint area on the packaging substrate 202 can be realized. Consequently, one or more overall area dimensions of the module 200 can be reduced significantly. In FIG. 3, the dashed rectangle 24 indicates an area occupied by the module 20 of FIG. 2, showing the reduction in the area occupied by the module 200 having the stack assembly 100.

Referring to the examples of FIGS. 2 and 3, it is noted that in the context of footprint areas of components alone, and without consideration of functionality and performance, the reduction in overall footprint area can be achieved by stacking of two components. In some embodiments, even more reduction in footprint area can be achieved if all three example components are arranged in a three-component stack. However, a stacking configuration with a plurality of components may result in, for example, difficulty or impossibility in manufacturing process, non- or reduced-functional configuration, and/or significant degradation of performance.

Figure 4:
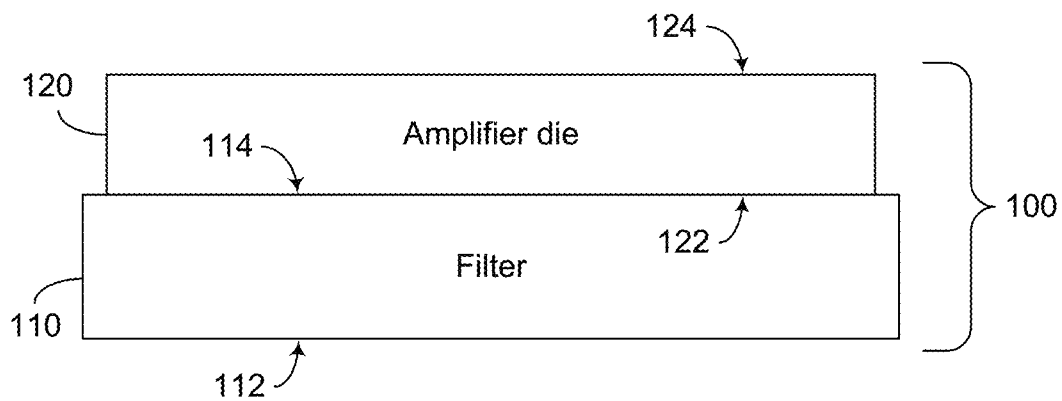
FIG. 4 shows that in some embodiments, the stack of FIGS. 1 and 3 can be a stack having an amplifier die mounted over a filter.

Described herein are examples of stack configurations that can provide significant reductions in footprint area, and also provide significant improvements in one or more performance parameters. For example, FIG. 4 shows that in some embodiments, the stack 100 of FIGS. 1 and 3 can be a stack 100 having an amplifier die 120 mounted over a filter 110. Accordingly, the amplifier die 120 and the filter 110 of FIG. 4 can be more specific examples of the RFIC die 120 and the electro-acoustic device 110, respectively, of FIGS. 1 and 3. In the example of FIG. 4, surfaces or sides 112, 114 of the filter 110 and surfaces or sides 122, 124 of the amplifier die 120 can be similar to those described in reference to FIG. 1.

Although various examples are described herein in the context of the amplifier die 120 and the filter 110, it will be understood that one or more features of the present disclosure can also be implemented with other types of RFIC die and/or other types of electro-acoustic devices 110.

Figure 5:
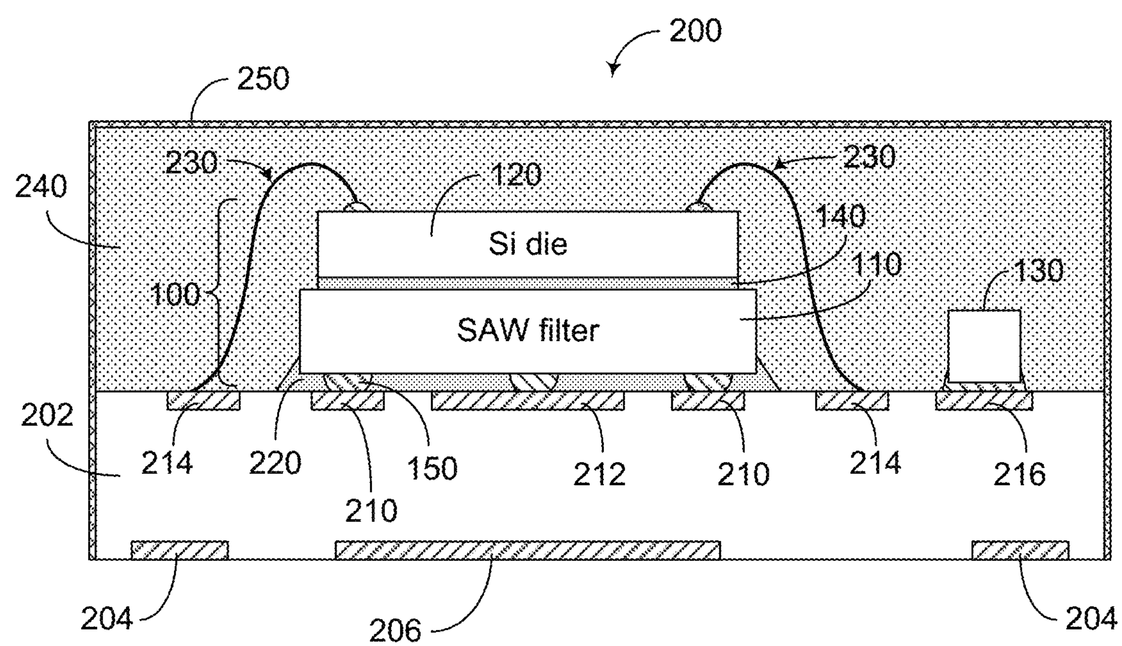
FIG. 5 shows that in some embodiments, a stack can include a surface acoustic wave (SAW) filter as an example of the filter of FIG. 4, and a silicon die as an example of the amplifier die of FIG. 4.

FIG. 5 shows that in some embodiments, a stack 100 can include a surface acoustic wave (SAW) filter 110 as an example of the filter 110 of FIG. 4, and a silicon die 120 as an example of the amplifier die 120 of FIG. 4. Although various examples are described herein in the context of the silicon amplifier die 120 and the SAW filter 110, it will be understood that one or more features of the present disclosure can also be implemented with other types of amplifier die and/or other types of filter 110.

In the example of FIG. 5, the stack 100 is shown to be part of a packaged module 200. More particularly, the packaged module 200 is shown to include a packaging substrate 202 having various contacts 204, 206 implemented on a mounting side. Such electrical contacts can be utilized to provide electrical connections and/or mounting functionality when the packaged module 200 is mounted on a circuit board (not shown). It will be understood that the mounting side of the packaging substrate 202 can be configured to allow different mounting configurations (e.g., ball-grid array (BGA), land-grid array (LGA), etc.).

The packaging substrate 202 in the example of FIG. 5 is shown to further include various contacts on the upper side, and be configured to receive a plurality of components. For example, contacts 216 can be configured to allow mounting of an SMD 130, contacts 210, 212 can be configured to allow mounting of the SAW filter 110 (e.g., with solder balls 150), and contacts 214 can be configured to receive respective ends of wirebonds 230. The contacts 216 can provide electrical connections and mounting functionality for the SMD 130. Similarly, the contacts 210, 212 can provide electrical connections and mounting functionality for the SAW filter 110. The contacts 214 can provide electrical connections for the silicon die 120. It will be understood that other types of mounting and/or electrical connections can be implemented for some or all of the components mounted over the packaging substrate 202.

Although not shown in FIG. 5, in some embodiments, the packaging substrate 202 can include various electrical connections and features such as conductive vias, metal traces, ground plane(s) and grounding features to support various electrical connection functionalities for the module 200. In some embodiments, the packaging substrate 202 can be, for example, a laminate substrate or a ceramic substrate.

In the example of FIG. 5, an underfill 220 is shown to be provided between the mounted SAW filter 110 and the packaging substrate 202. Further, an overmold 240 is shown to be formed over the packaging substrate 202 so as to substantially encapsulate the various components mounted on the packaging substrate 202.

In the example of FIG. 5, the packaged module 200 is shown to include a conductive layer 250 formed on the upper surface and side walls of the module 200 to provide RF shielding functionality. Examples related to such an RF shield can be found in U.S. Publication No. 2017/0117184 entitled DEVICES AND METHODS RELATED TO FABRICATION OF SHIELDED MODULES, which is expressly incorporated by reference in its entirely, and its disclosure is to be considered part of the specification of the present application.

In the example of FIG. 5, the stack 100 is shown to include the silicon die 120 mounted over the SAW filter 110. More particularly, the underside of the silicon die 120 is shown to be mounted to the upper side of the SAW filter 110 by a mounting layer 140. Examples related to such mounting of the silicon die 120 onto the SAW filter 110 are described herein in greater detail Configured in the foregoing manner, various electrical connectivity, such as signal and ground connections, can be provided for the SAW filter 110 through the solder balls 150 and the respective contacts (210, 212) of the packaging substrate 202. Various electrical connectivity, such as power, control, signal and ground connections, can be provided for the silicon die 120 through the wirebonds 230 and the respective contacts 214. Accordingly, in the example of FIG. 5, one or more electrical connections between the SAW filter 110 and the silicon die 120 can be made through one or more of the solder balls 150, one or more of the electrical connections of the packaging substrate 202, and one or more of the wirebonds 230. It will be understood that in some embodiments, either or both of the SAW filter 110 and the silicon die 120 can be configured so that one or more electrical connections can be made directly therebetween (e.g., through the mounting interface between the SAW filter and the silicon die).

FIG. 6 shows an example of an RF circuit or architecture that can be implemented in a module (20 or 200). In the example of FIG. 6, such a module can be configured to filter and amplify a relatively weak signal received through an antenna. More particularly, the received signal (RF_IN) can be provided to a filter 110, and the filtered signal can be provided to a low-noise amplifier (LNA) for amplification. The LNA can be operated with a bias circuit that provides, for example, supply and bias voltages for one or more amplifying transistors of the LNA. Such a bias circuit can be operated with a supply voltage (e.g., VCC) and a control signal (e.g., LNA_EN). From the LNA, the amplified signal can be provided to an output match circuit 132, and the impedance matched signal can be provided as an output (RF_OUT) of the module.

In the example LNA architecture of FIG. 6, the filter 110 can be, for example, a SAW filter; the LNA (and the bias circuit) 120 can be implemented as, for example, a silicon die; and the output match circuit 132 can include, for example, an SMD (130 in FIGS. 2 and 3) such as an inductor. Accordingly, if the filter 110 and the LNA die 120 are not in a stack configuration, such components can be arranged on a packaging substrate similar to the example of FIG. 2. If the filter 110 and the LNA die 120 are in a stack configuration, such a stack can be arranged on a packaging substrate similar to the example of FIG. 3.

In some embodiments, the LNA architecture of FIG. 6 can be configured to process signals having frequencies associated with global positioning systems (GPS). In such a configuration, the module (20 or 200) associated with the LNA architecture can be implemented as a GPS module.

FIG. 7 shows an example layout of the LNA architecture of FIG. 6, in which the SAW filter 110 and the LNA die 120 are arranged in a non-stack arrangement in a GPS module 20, similar to the example of FIG. 2. FIG. 8 shows an example layout of the LNA architecture of FIG. 6, in which the SAW filter 110 and the LNA die 120 are arranged in a stack arrangement in a GPS module 200, similar to the example of FIG. 3.

Referring to FIG. 7, the GPS module 20 is shown to include a packaging substrate 22; and mounted on such a packaging substrate are the SAW filter 110, the LNA die 120, and an SMD 130 such as an inductor. Various electrical connections associated with such components are shown to be provided by metal traces 30 associated with the packaging substrate 22 (and respective vias, if applicable), and wirebonds 32 associated with the LNA die 120. For the example GPS module 20, overall lateral dimensions are shown to be approximately 1.6 mm×1.3 mm.

Referring to FIG. 8, the GPS module 200 is shown to include a packaging substrate 202; and mounted on such a packaging substrate are the stack 100 (having the LNA die 120 mounted over the SAW filter 110), and an SMD 130 such as an inductor. Various electrical connections associated with such components are shown to be provided by metal traces 232 associated with the packaging substrate 202 (and respective vias, if applicable), and wirebonds 230 associated with the LNA die 120. For the example GPS module 200, overall lateral dimensions are shown to be approximately 1.3 mm×1.3 mm, such that the area of the GPS module 200 of FIG. 8 is approximately 19% less than the area of the GPS module 20 of FIG. 7.

Figure 9:
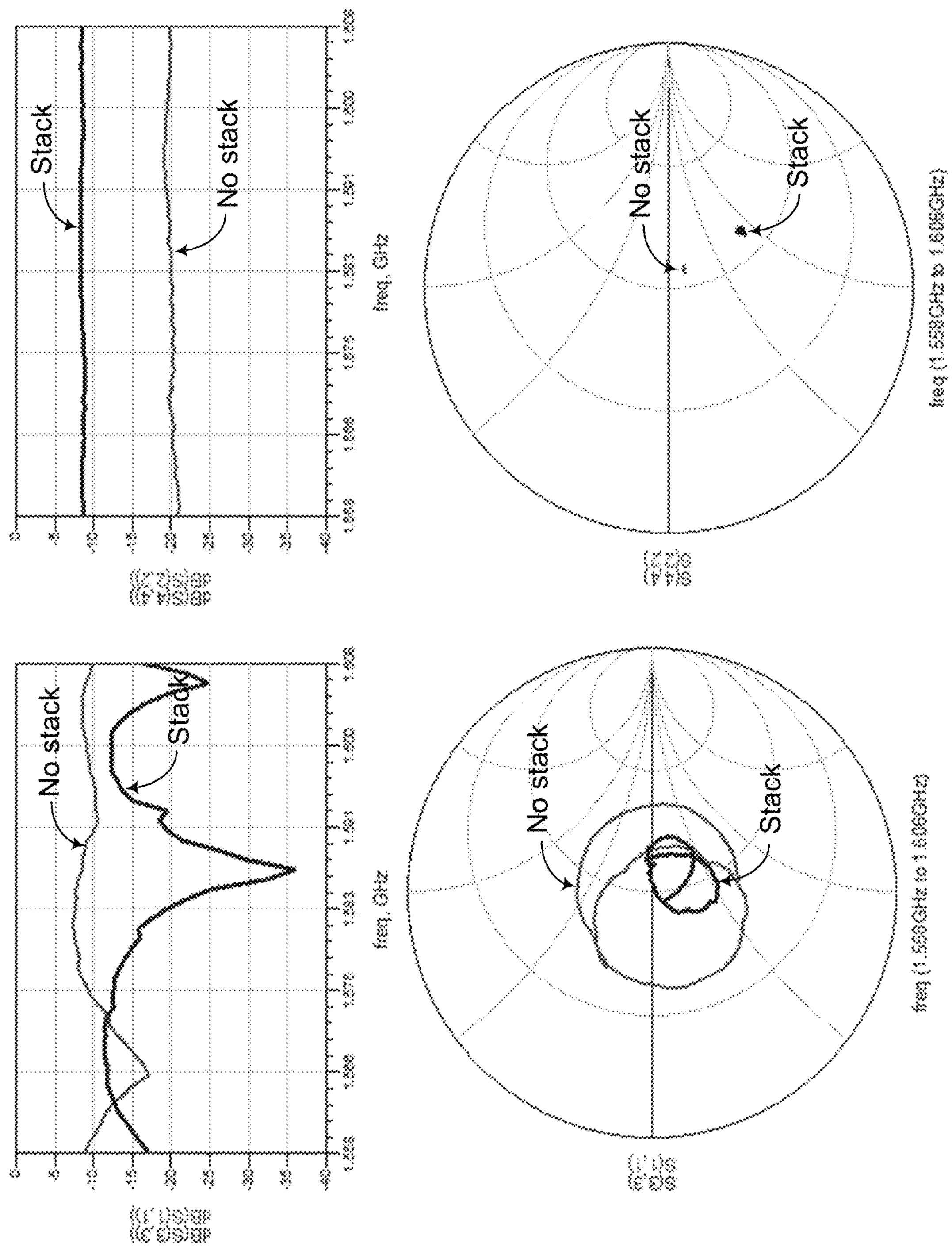
FIG. 9 shows comparisons of performance parameters between the non-stack configuration of FIG. 7 and the stack configuration of FIG. 8.
Figure 10:
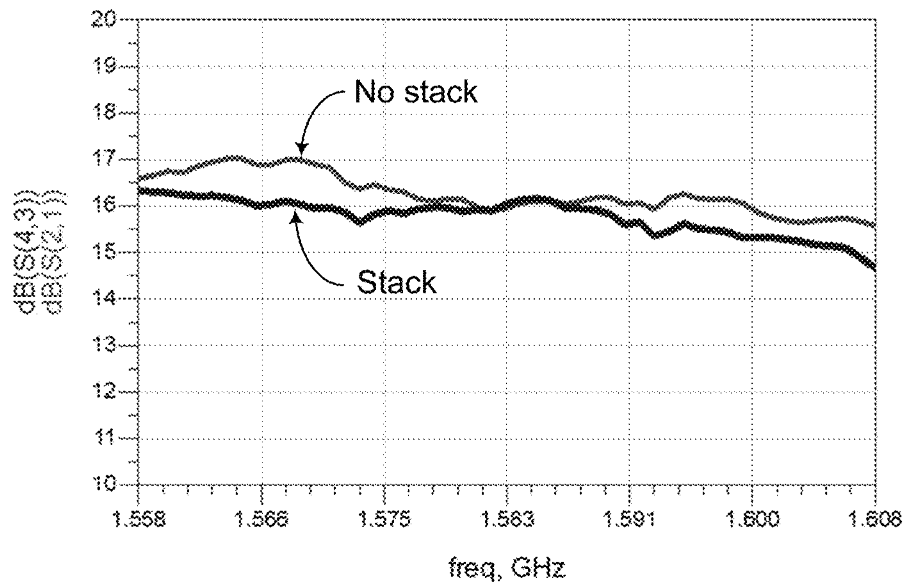
FIG. 10 shows a comparison of gain plots of the non-stack configuration of FIG. 7 and the stack configuration of FIG. 8.
Figure 11:
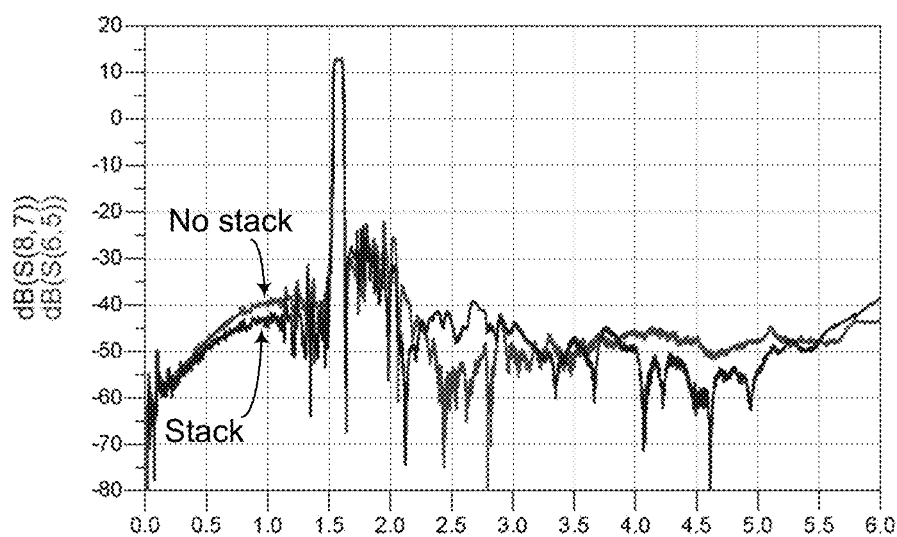
FIG. 11 shows another comparison of gain plots of the non-stack configuration of FIG. 7 and the stack configuration of FIG. 8.

FIGS. 9-11 show various plots associated with the GPS module 20 of FIG. 7 and the GPS module 200 of FIG. 8. More particularly, the upper left panel of FIG. 9 shows input return loss plots for the "No stack" configuration of FIG. 7 and the "Stack" configuration of FIG. 8, in a frequency range from 1.558 GHz to 1.608 GHz. The upper right panel of FIG. 9 shows output return loss plots for the "No stack" configuration of FIG. 7 and the "Stack" configuration of FIG. 8, in a frequency range from 1.558 GHz to 1.608 GHz. The lower left panel of FIG. 9 shows Smith chart input contour plots for the "No stack" configuration of FIG. 7 and the "Stack" configuration of FIG. 8, in a frequency range from 1.558 GHz to 1.606 GHz. The lower right panel of FIG. 9 shows Smith chart output contour plots for the "No stack" configuration of FIG. 7 and the "Stack" configuration of FIG. 8, in a frequency range from 1.558 GHz to 1.606 GHz.

Referring to the foregoing plots of FIG. 9, it is noted that the input return loss (e.g., upper left panel, at a GPS frequency of 1.575 GHz) associated with the GPS module 200 of FIG. 8 is desirably reduced when compared to the input loss associated with the GPS module 20 of FIG. 7. It is further noted that the input contour of the Smith chart scan (lower left panel) for the GPS module 200 of FIG. 8 is significantly and desirably tighter about a desired impedance when compared to the corresponding scan associated with the GPS module 20 of FIG. 7.

In FIG. 10, gain plots are shown for the "No stack" configuration of FIG. 7 and the "Stack" configuration of FIG. 8, in a frequency range from 1.558 GHz to 1.608 GHz. In FIG. 11, gain plots are shown for the "No stack" configuration of FIG. 7 and the "Stack" configuration of FIG. 8, in a wider frequency range from 0 GHz to 6.0 GHz. Referring to the plots of FIGS. 10 and 11, it is noted that the gain performance of the GPS module 200 of FIG. 8 is not degraded in a significant manner when compared to the gain performance of the GPS module 20 of FIG. 7.

In some embodiments, the performance improvements described above in reference to FIG. 9 can result from reduction in lengths of metal traces that can be utilized in the GPS module 200 of FIG. 8. For example, since the SAW filter 110 and the LNA die 120 are stacked, they essentially occupy the same footprint area on the packaging substrate 202. Thus, some or all of electrical connections (e.g., including the signal path for the filtered and un-amplified signal from the filter to the LNA) can be implemented with metal traces having shorter lateral dimensions. Accordingly, undesirable effects such as parasitic capacitance and mismatch can be reduced with such shorter metal traces.

As described herein, stacking of an amplifier die such as an LNA die with a filter such as a SAW filter can provide a desirable reduction in lateral size of a module. As also described herein, such a reduction in module size can also be accompanied with a performance improvement in one or more operating parameters.

Figure 12:
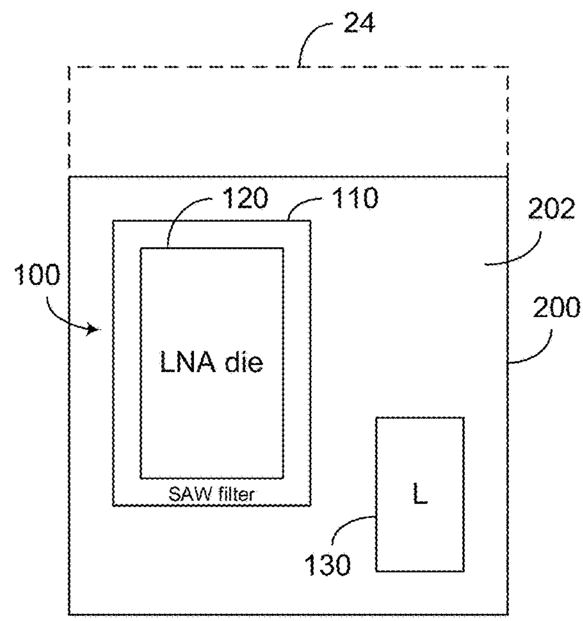
FIG. 12 shows an example in which a stack of an amplifier die such as an LNA die with a filter such as a SAW filter can result in a reduced size of a packaging substrate of a module.
Figure 13:
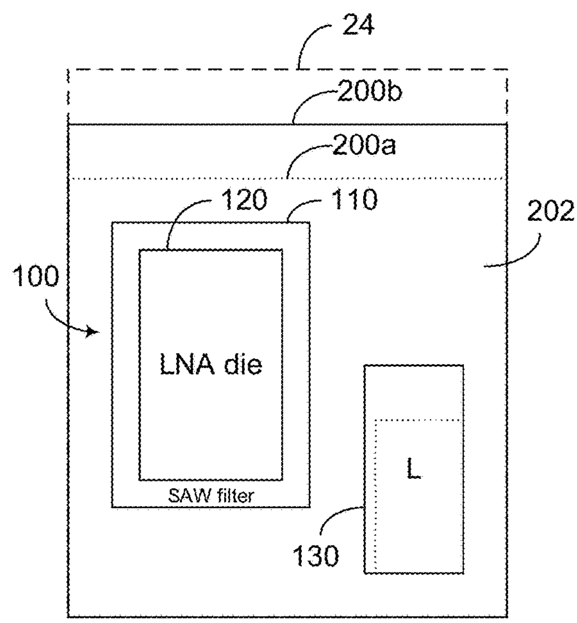
FIG. 13 shows that the reduced footprint area provided by the stack of FIG. 12 can allow use of a higher performance component such as a higher performance inductor.
Figure 14:
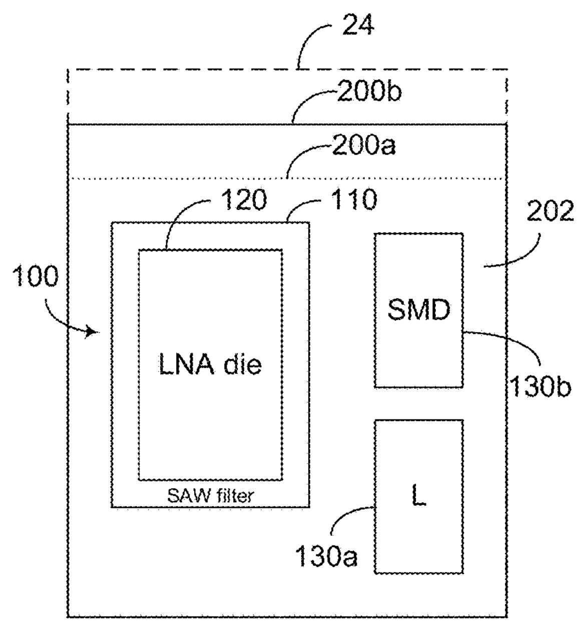
FIG. 14 shows that the reduced footprint area provided by the stack of FIG. 12 can allow use of an additional component.

FIGS. 12-14 show that the stacking of an amplifier die such as an LNA die with a filter such as a SAW filter can also provide additional benefits in terms of design flexibility. For example, and referring to FIG. 12, suppose that a stack 100 of an amplifier die such as an LNA die 120 with a filter such as a SAW filter 110 results in a reduced size of the packaging substrate 202 of a module 200, similar to the examples of FIGS. 3 and 8. Suppose further that the LNA die 120, the SAW filter 110 and the inductor 130 are substantially identical individually in the module 200 and in another module without such a stack (i.e., the die and filter are arranged in a non-stack configuration). With such assumptions, the reduced size of the packaging substrate 202 (relative to a footprint 24 of a module without a stack) can be attributed to the stacking configuration.

It is noted that in some embodiments, the reduced size of the module may be required or desirable. However, in some embodiments, such reduction may not be as important. In such an application, one can still utilize the stack configuration, and the resulting area made available by the stack can be utilized to provide performance improvement for the module.

For example, FIG. 13 shows that a higher performance component 130 such as a higher performance inductor can be utilized in a module 200*b* having a space made available by the stack 100. Such a higher performance inductor (130) is shown to be larger than the inductor of FIG. 12 (depicted as a dotted rectangle in FIG. 13); however, such a larger inductor can be accommodated by some or all of the space made available by the stack 100. Accordingly, the module 200*b* can have a size that is between the size of the non-stack module 24 and the size of the module 200*a* that is similar to the module 200 of FIG. 12. Further, the performance of the module 200*b* can be improved by the use of the higher performance component 130.

In another example, FIG. 14 shows that an additional component 130*b* can be utilized in a module 200*b* having a space made available by the stack 100. Such an additional component can be utilized with an existing component 130*a*; and its presence can be accommodated by some or all of the space made available by the stack 100. Accordingly, the module 200*b* can have a size that is between the size of the non-stack module 24 and the size of the module 200*a* that is similar to the module 200 of FIG. 12. Further, the performance of the module 200*b* can be improved by the use of the additional component 130*b*.

FIGS. 15-21 show examples of design considerations that can be implemented for a stack 100 having one or more features as described herein. FIG. 15A depicts a side sectional view of a stack 100 having a silicon die 120 mounted on a SAW filter 110 with a mounting layer 140 (e.g., a resin layer). The SAW filter 110 is shown to include a cavity 166 defined by a piezoelectric substrate 164 and a structure 160. Implemented on the cavity surface of the piezoelectric substrate 164 are a plurality of interdigital transducers (IDTs) 168 that are coupled to contacts 162. Thus, an electrical signal provided to an IDT results in an acoustic wave being established with a sharply defined frequency; and such an acoustic wave can be converted back to an electrical (filtered) signal through another IDT.

Figure 15A:
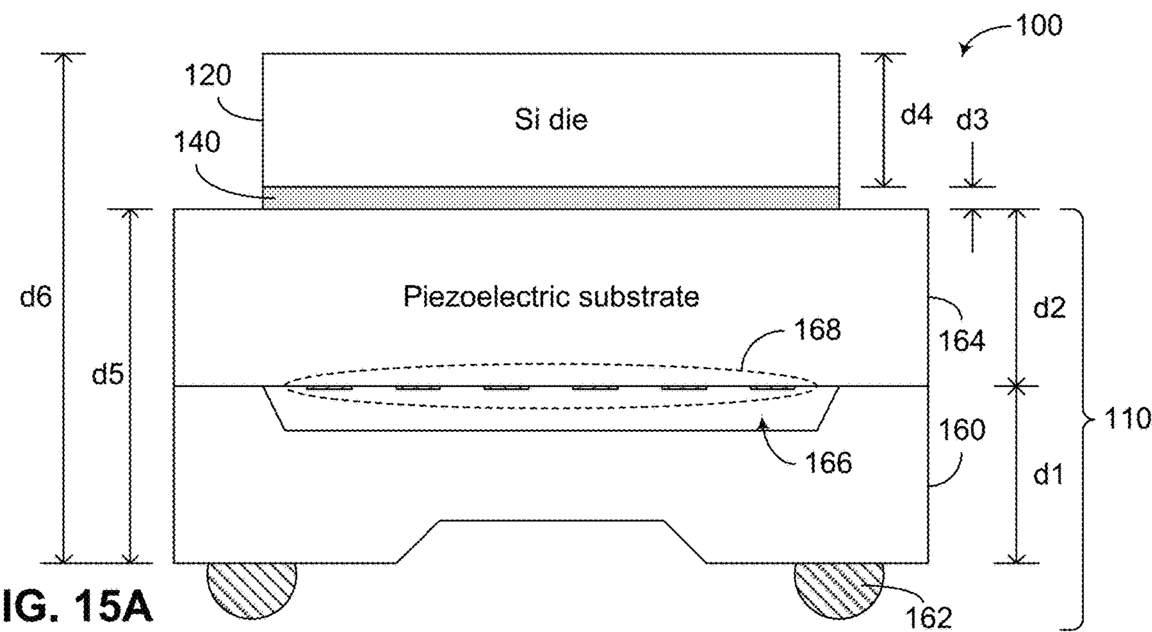
FIG. 15A depicts a side sectional view of an example stack having a silicon die mounted on a SAW filter with a mounting layer.
Figure 15B:
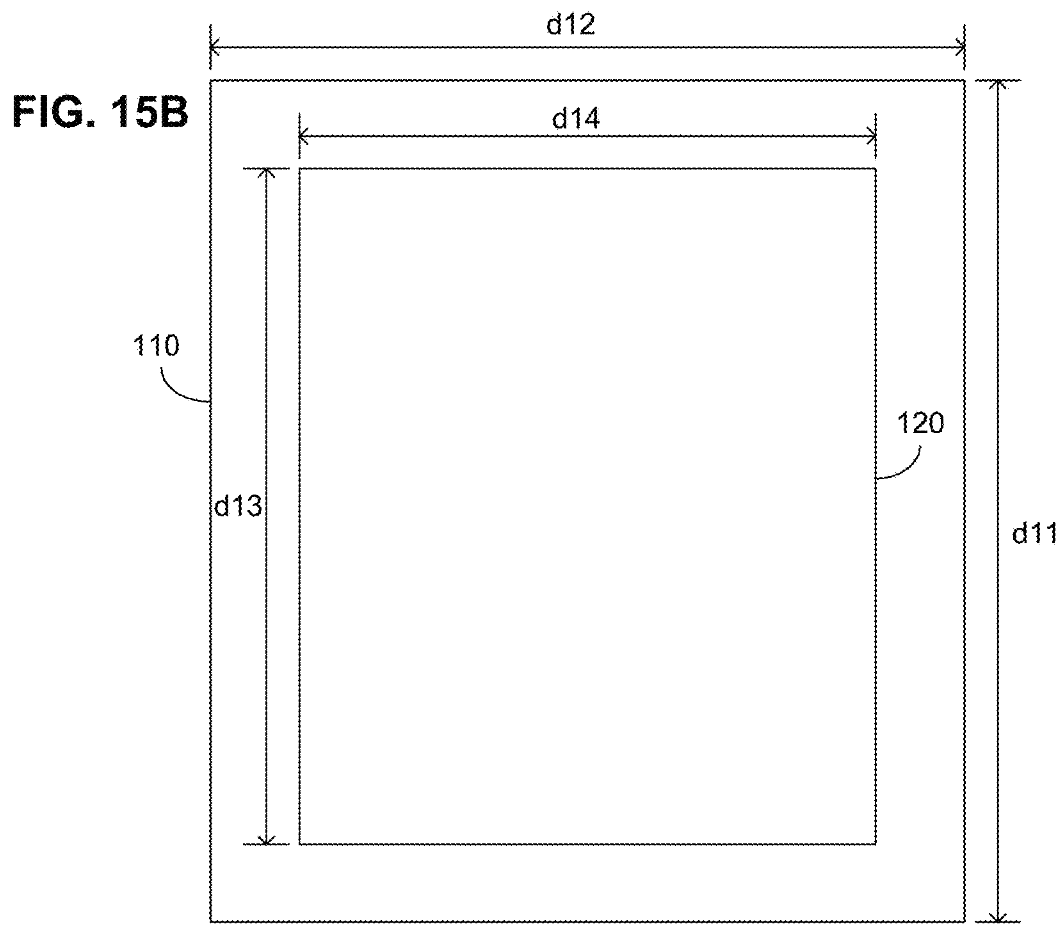
FIG. 15B shows a plan view of the example stack of FIG. 15A.

FIG. 15B shows a plan view of the stack 100 of FIG. 15A. In the example of FIGS. 15A and 15B, the dimensions listed in Table 1 can be assigned. Some of such dimensions are referenced in the examples of FIGS. 16-21.

TABLE 1

| Dimension | Part |
|---|---|
| d1 | Thickness of lower portion 160 of SAW filter |
| d2 | Thickness of piezoelectric substrate 164 |
| d3 | Thickness of mounting layer 140 |
| d4 | Thickness of silicon die 120 |
| d5 | Overall thickness of SAW filter 110 |
| d6 | Overall thickness of stack 100 |
| d11 | First lateral dimension of SAW filter 110 |
| d12 | Second lateral dimension of SAW filter 110 |
| d13 | First lateral dimension of silicon die 120 |
| d14 | Second lateral dimension of silicon die 120 |

Figure 17:
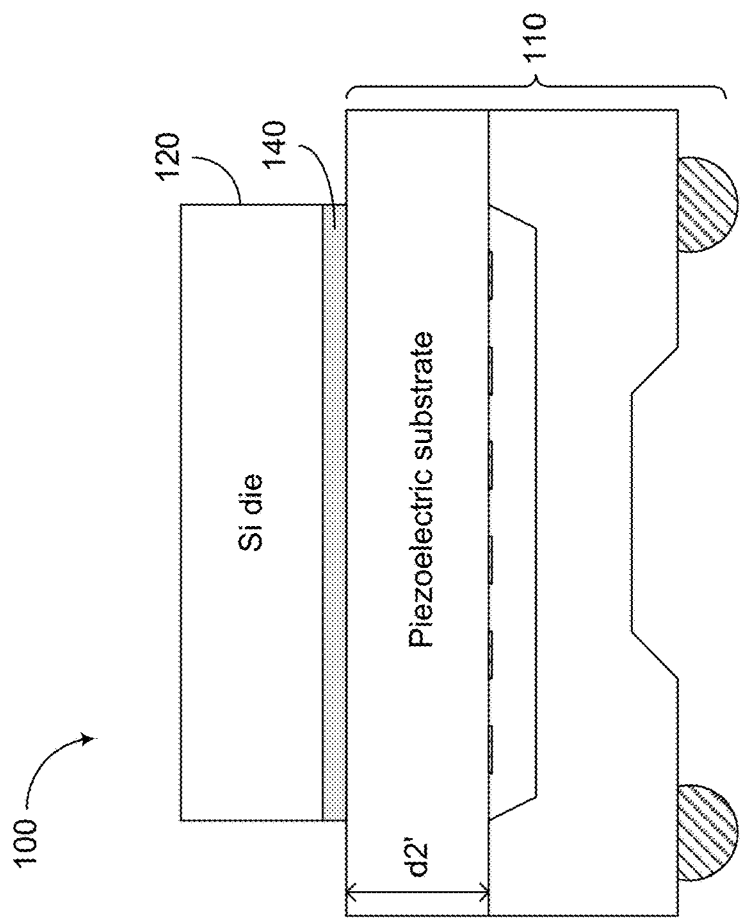
FIG. 17 shows that in some embodiments, a SAW filter can include a piezoelectric substrate having a reduced-thickness, with a silicon die and/or a mounting layer over the piezoelectric substrate countering some or all of any negative effects that may arise from the reduced thickness of the piezoelectric substrate.
Figure 16:
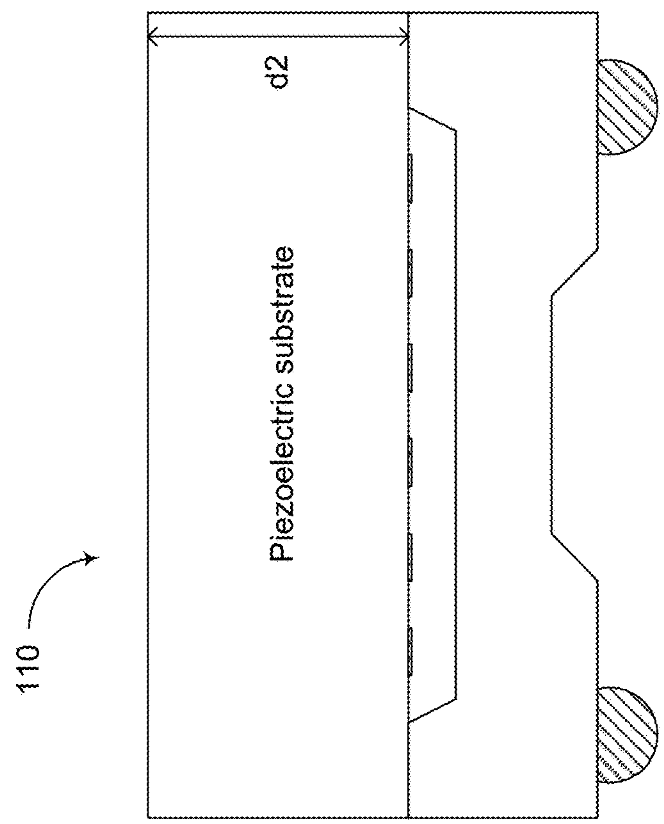
FIG. 16 shows an example SAW filter device having a piezoelectric substrate.

FIGS. 16 and 17 show that in some embodiments, a stack 100 having one or more features as described herein can be implemented such that a silicon die 120 mounted on a SAW filter 110 can enhance one or more functionalities of the SAW filter 110, and therefore the corresponding module. For example, and referring to FIG. 16, suppose that a given SAW filter 110 has a piezoelectric substrate with a thickness of d2. When utilized in a module by itself (e.g., without stacking), such a SAW filter can provide certain filtering performance and mechanical property.

In some embodiments, the piezoelectric substrate of a SAW filter can provide mechanical integrity of the SAW filter, and/or impact the acoustic property of the SAW filter. Thus, when another structure such as a silicon die is mounted on such a substrate, at least the acoustic property of the SAW filter may be impacted. In the examples described herein in reference to FIGS. 7-11, the stacking of the silicon die over the SAW filter (with an original piezoelectric substrate thickness) does not appear to negatively impact the filtering performance of the SAW filter. However, such a stack in the examples of FIGS. 7-11 has associated with it an increase in vertical dimension beyond the full thickness of the original piezoelectric substrate.

In some applications, it may be desirable to reduce the overall height of a stack having one or more features as described herein. To achieve such a height reduction, the piezoelectric substrate thickness can be reduced in some embodiments. However, such a thickness reduction can result in degradation of mechanical integrity of the SAW filter (when by itself) and/or filtering performance.

FIG. 17 shows that in some embodiments, a SAW filter 110 can include a piezoelectric substrate having a reduced-thickness dimension d2'. In some embodiments, a silicon die 120 and/or a mounting layer 140 over the piezoelectric substrate can be configured to counter some or all of any negative effects that may arise from the reduced thickness of the piezoelectric substrate. Thus, in the example of FIG. 17, the piezoelectric substrate is shown to have a significantly reduced thickness (d2') when compared to the original thickness (d2) of FIG. 16. With the addition of the mounting layer 140 and the silicon die 120, the overall height is shown to be greater than that of the original SAW filter of FIG. 16, but lower than the height resulting from a stack with the original SAW filter (with a piezoelectric substrate thickness of d2).

Figure 18:
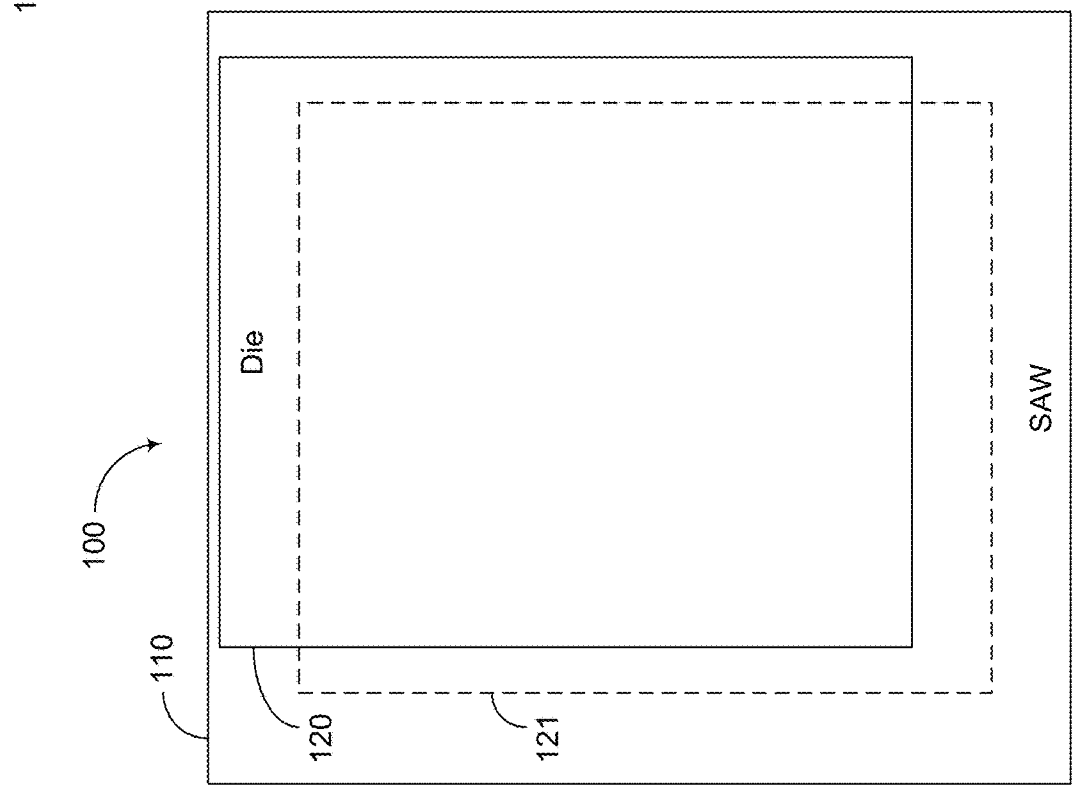
FIG. 18 shows that in some embodiments, a die can be mounted to be off-centered with respect to the footprint of a SAW filter.

In some embodiments, a die can be mounted over a SAW filter so as to be generally centered laterally with respect to the footprint of the SAW filter. FIG. 18 shows that in some embodiments, a die 120 can be mounted to be off-centered with respect to the footprint of a SAW filter 110. In FIG. 18, the center position on the SAW filter 110 is depicted as a dashed rectangle 121. In some applications, such an off-centered mounting of the die may be desirable to, for example, adjust the acoustic property of the SAW filter, to reduce/increase wirebond lengths, etc.

Figure 19:
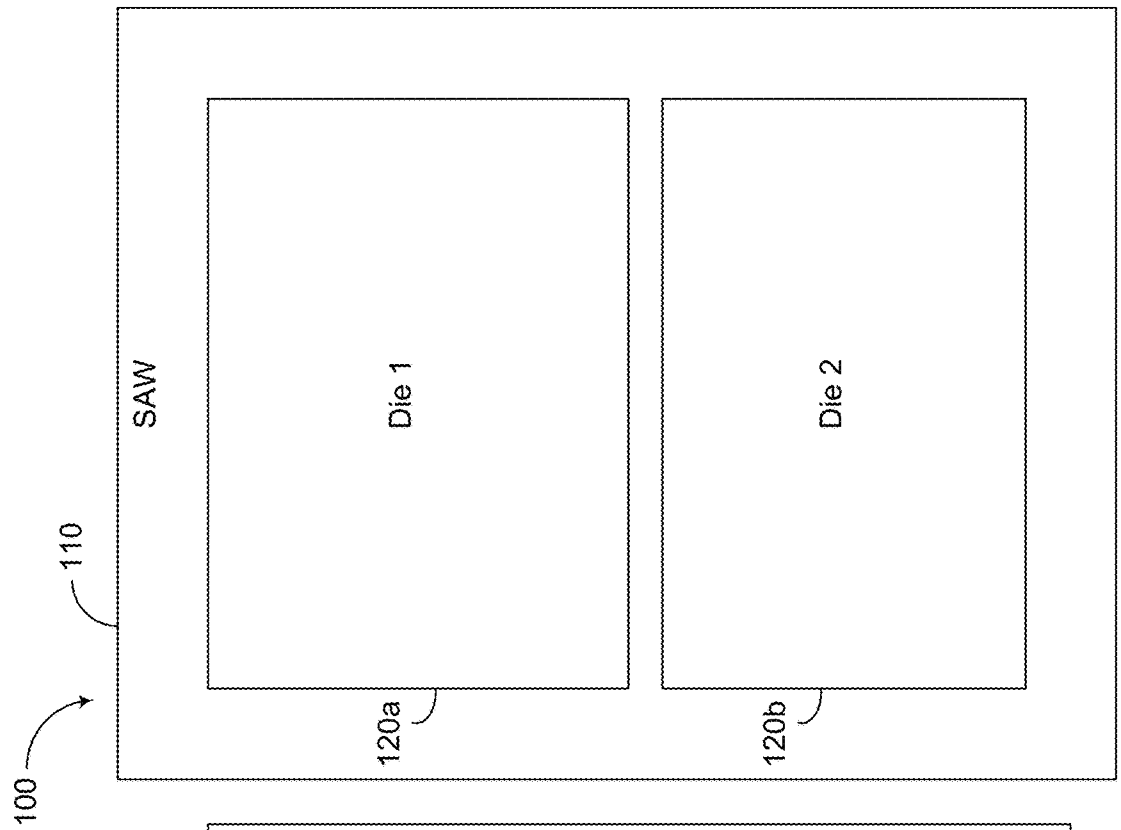
FIG. 19 shows that in some embodiments, a stack can include more than one die mounted over a SAW filter.

FIG. 19 shows that in some embodiments, a stack 100 can include more than one die mounted over a SAW filter 110. For example, first and second die 120*a*, 120*b* are shown to be mounted over the SAW filter 110. Such first and second die may or may not be the same type (e.g., one a silicon die, and the other a non-silicon die), and may or may not provide similar functionality (e.g., one an amplifier die, and the other a non-amplifier die).

Figures 20, 21:
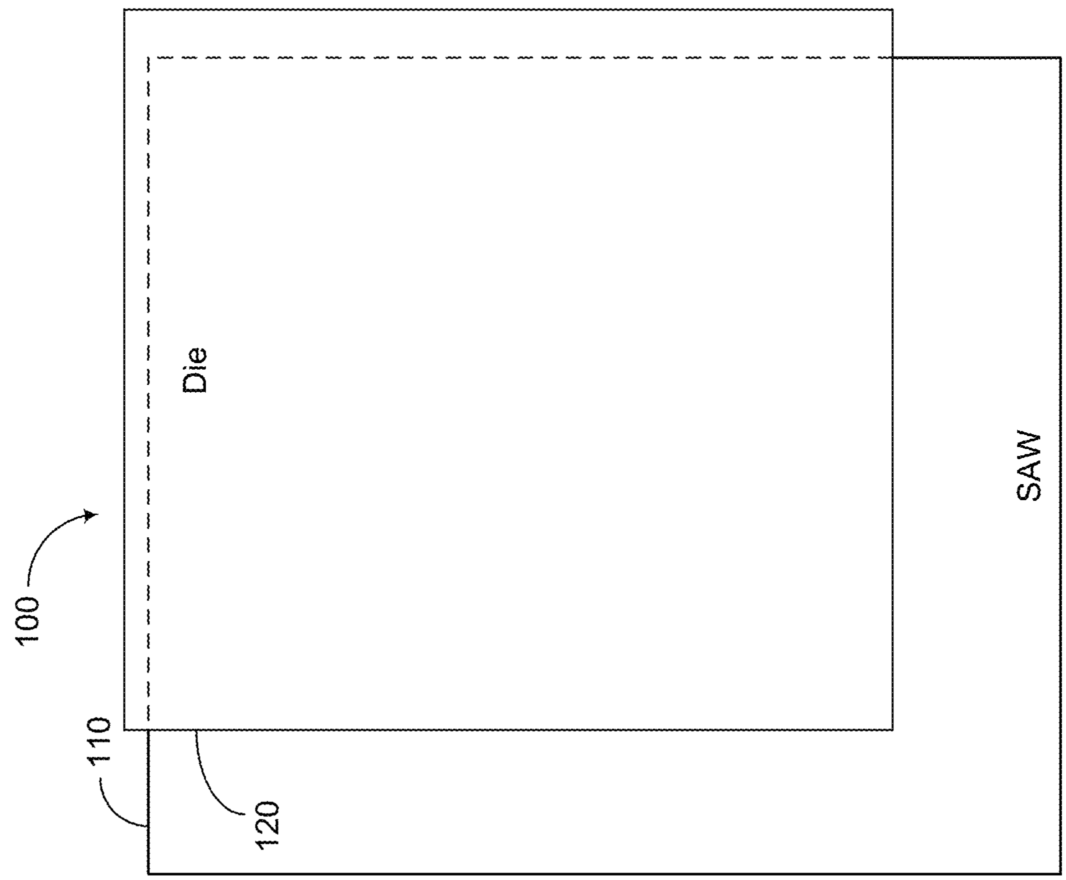
FIG. 20 shows that in some embodiments, a die can be mounted such that one or more edges of the die overhang corresponding edge(s) of a SAW filter.
FIG. 21 shows that in some embodiments, a die mounted over a SAW filter may or may not have a smaller area than the area of the SAW filter.

FIG. 20 shows that in some embodiments, a die 120 can be mounted such that one or more edges of the die 120 overhang corresponding edge(s) of a SAW filter 110. Similar to the example of FIG. 18, such an overhanging mounting of the die 120 may be desirable to, for example, adjust the acoustic property of the SAW filter, to reduce/increase wirebond lengths, etc.

In the various examples described herein, a die mounted over a SAW filter is assumed to have a smaller area than the area of the SAW filter. FIG. 21 shows that in some embodiments, such an assumption is not a requirement. For example, in FIG. 21, a die 120 is shown to have each of first and second dimensions (d13 and d14 in Table 1) greater than respective first and second dimensions (d11 and d12) of a SAW filter 110. It will be understood that other configurations are also possible. For example, a die can have a first dimension greater than a first dimension of a corresponding SAW filter, but the die's second dimension can be less than the SAW filter's second dimension. In another example, a die can have a first dimension less than a first dimension of a corresponding SAW filter, but the die's second dimension can be greater than the SAW filter's second dimension.

Figure 22A:
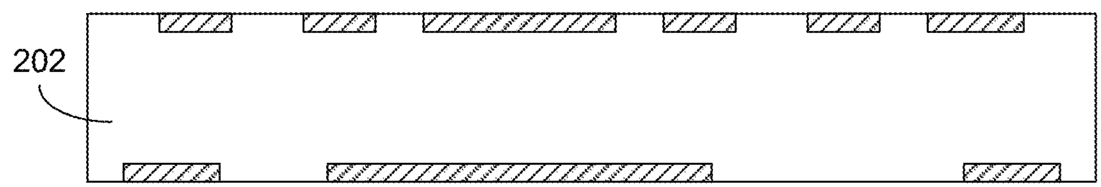
FIGS. 22A-22H show an example of how a packaged module having one or more features as described herein can be fabricated.

FIGS. 22A-22H show an example of how a packaged module having one or more features as described herein can be fabricated. In FIG. 22A, a packaging substrate 202 can be formed or provided. In some embodiments, such a packaging substrate can be similar to the example described in reference to FIG. 5.

Figure 22B:
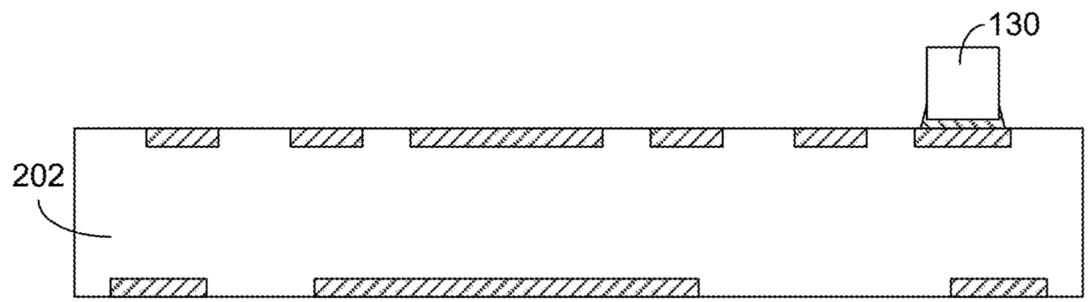

In FIG. 22B, an SMD 130 can be mounted on the packaging substrate 202. In some embodiments, such an SMD can be, for example, an inductor or a capacitor.

Figure 22C:
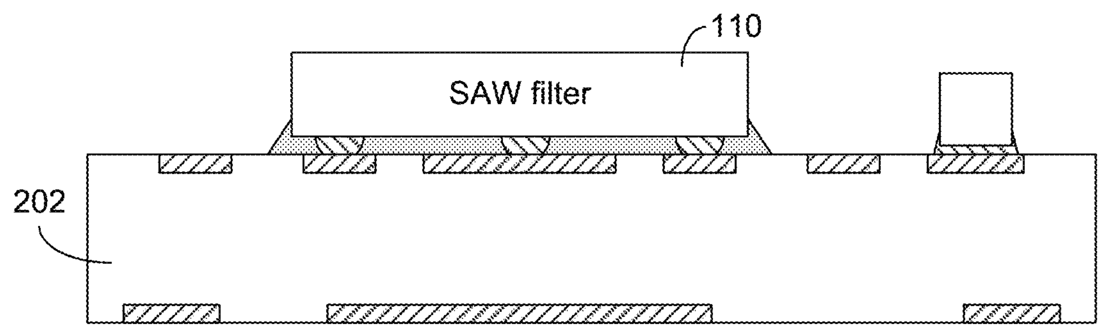

In FIG. 22C, a SAW filter 110 can be mounted on the packaging substrate 202. In some embodiments, such a mounting of the SAW filter 110 can include soldering facilitated by an array of solder balls, and an underfill process.

Figure 22D:
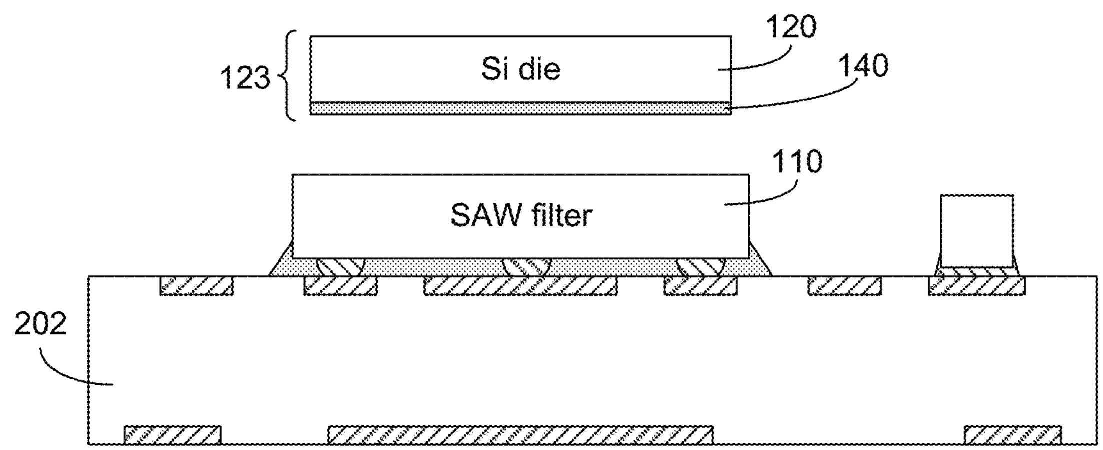

In FIG. 22D, a silicon die 120 can be mounted on the SAW filter 110. In some embodiments, such a mounting of the silicon die 120 can include forming an assembly 123 of the silicon die 120 and a resin layer 140, followed by placing the assembly 123 on the SAW filter 110. It will be understood that in some embodiments, other attachment sequence can be utilized. For example, a resin layer 140 can be placed or formed on the SAW filter 110, and the silicon die 120 without a resin layer can be placed on the resin layer 140.

Figure 22E:
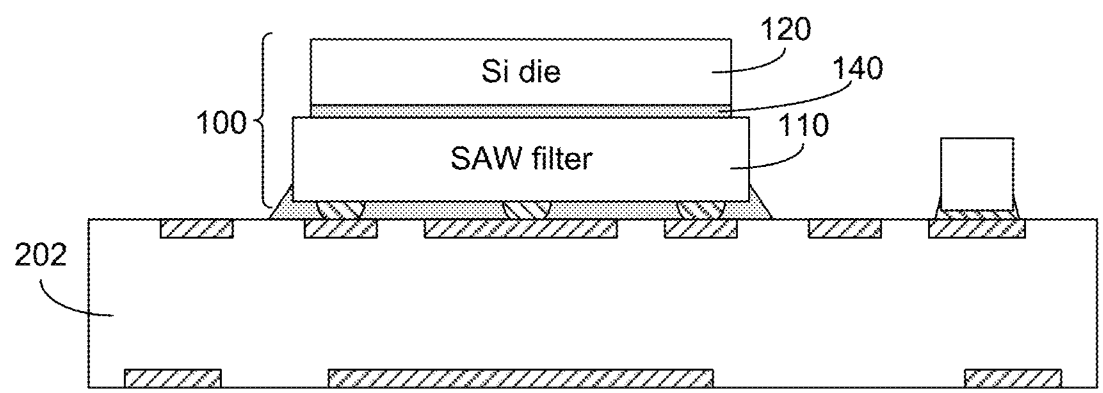

In FIG. 22E, a stack 100 is shown to be formed from the mounting of the silicon die 120 on the SAW filter 110. In some embodiments, such an assembly of FIG. 22E can be subjected to heat to cure the resin layer 140 to securely attach the silicon die on the SAW filter 110.

Figure 22F:
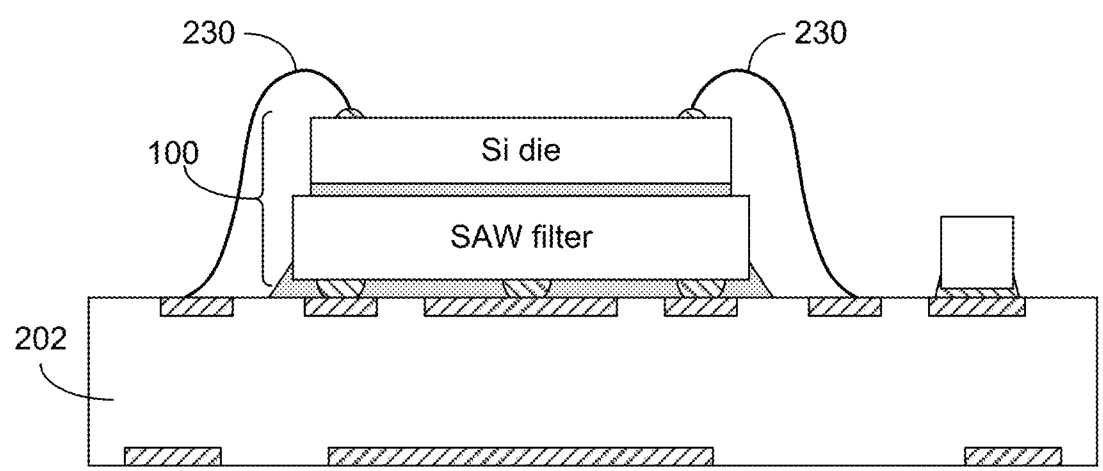

In FIG. 22F, a plurality of wirebonds 230 can be formed between the silicon die and respective contacts on the packaging substrate 202.

Figure 22G:
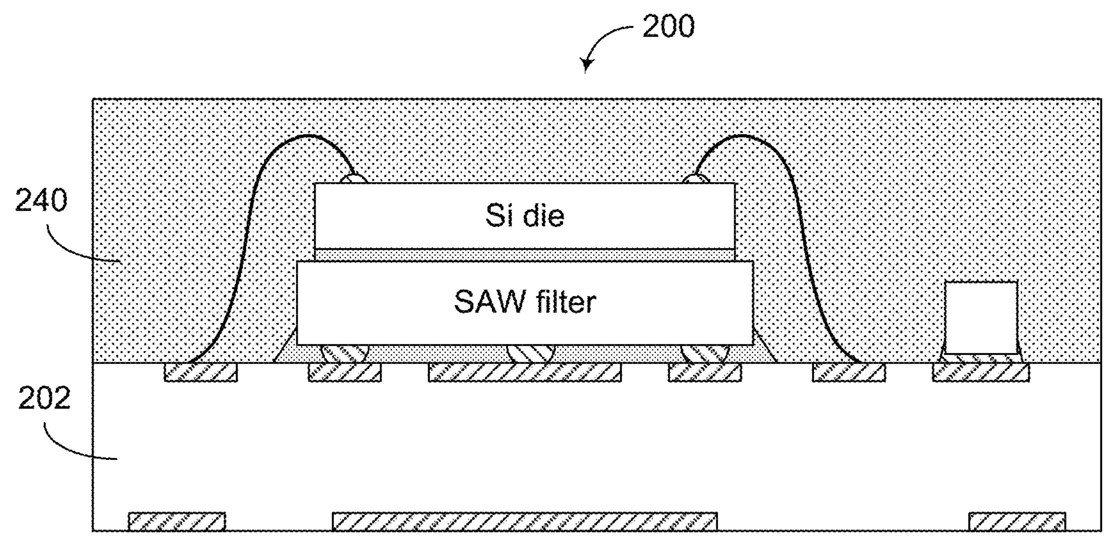

In FIG. 22G, an overmold 240 can be formed over the packaging substrate to encapsulate the stack (100), the wirebonds (230) and the SMD (130). In some embodiments, the assembly in FIG. 22G can be a completed module 200, if shielding functionality is not desired or needed.

Figure 22H:
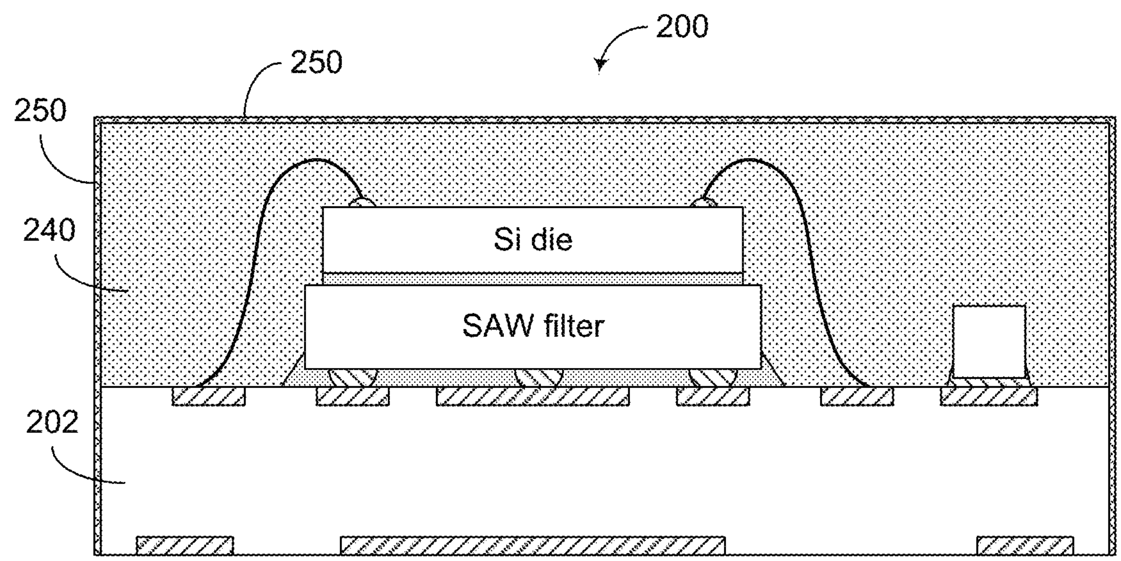

In FIG. 22H, a conductive layer 250 can be formed on the upper surface of the overmold 240 and the side walls of the module 200. In some embodiments, such a conductive layer can be formed utilizing a conformal deposition technique, such as the examples described in the above-referenced U.S. Publication No. 2017/0117184. In some embodiments, the assembly in FIG. 22H can be a completed module 200, if shielding functionality is desired or needed.

In the various example stages of FIGS. 22A-22H, fabrication of a single module is described. It will be understood that in some embodiments, an array of individual units can be processed together while in a panel format. For example, the packaging substrate 202 of FIG. 22A can be a unit in a panel having an array of such units. With such a panel, steps associated with FIGS. 22B-22G can be performed with the units are still in the panel format. Upon completion of the overmold step of FIG. 22G, multiple modules can be formed by singulating the panel into multiple individual units. In some embodiments, formation of the conformal shield coating 250 can be formed for the singulated individual units utilizing the example techniques described in the above-referenced U.S. Publication No. 2017/0117184.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 23:
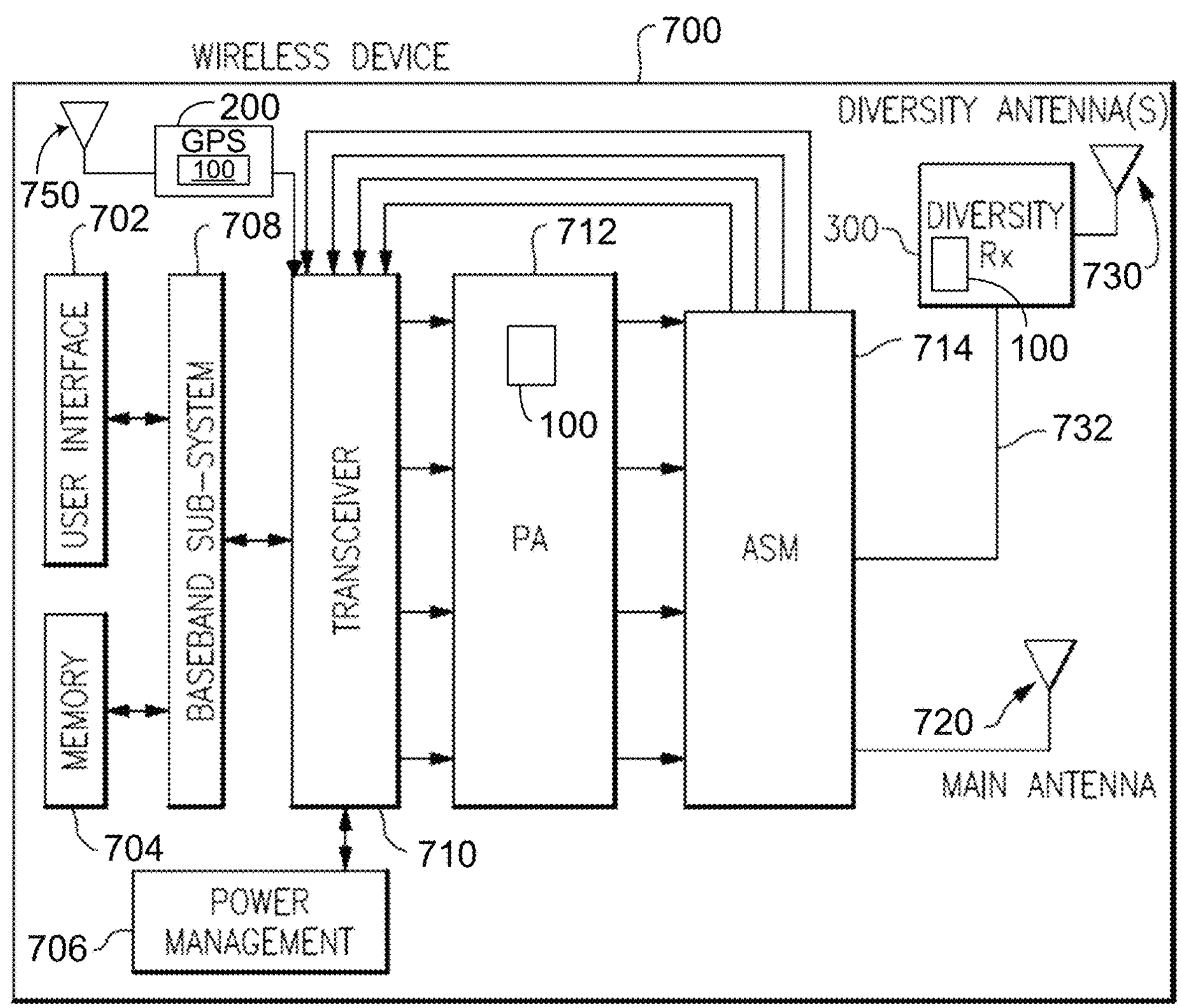
FIG. 23 depicts an example wireless device having one or more advantageous features described herein.

FIG. 23 depicts an example wireless device 700 having one or more advantageous features described herein. As described herein, one or more stacks having one or more features as described herein can be implemented in a number of places in such a wireless device. For example, in some embodiments, a stack 100 as described herein can be implemented in a module such as a diversity receive (DRx) module 300 having one or more low-noise amplifiers (LNAs). In another example, a stack 100 as described herein can be implemented in a power amplifier module 712.

In yet another example, a stack 100 as described herein can be implemented in a GPS module 200. Such a GPS module can be configured to filter and amplify a signal received through a GPS antenna 750.

In the example of FIG. 23, power amplifiers (PAs) in the PA module 712 can receive their respective RF signals from a transceiver 710 that can be configured and operated to generate RF signals to be amplified and transmitted, and to process received signals. The transceiver 710 is shown to interact with a baseband sub-system 708 that is configured to provide conversion between data and/or voice signals suitable for a user and RF signals suitable for the transceiver 710. The transceiver 710 is also shown to be connected to a power management component 706 that is configured to manage power for the operation of the wireless device 700. Such power management can also control operations of the baseband sub-system 708 and other components of the wireless device 700.

The baseband sub-system 708 is shown to be connected to a user interface 702 to facilitate various input and output of voice and/or data provided to and received from the user. The baseband sub-system 708 can also be connected to a memory 704 that is configured to store data and/or instructions to facilitate the operation of the wireless device, and/or to provide storage of information for the user.

In the example of FIG. 23, the DRx module 300 can be implemented between one or more diversity antennas (e.g., diversity antenna 730) and the ASM 714. Such a configuration can allow an RF signal received through the diversity antenna 730 to be processed (in some embodiments, including amplification by an LNA) with little or no loss of and/or little or no addition of noise to the RF signal from the diversity antenna 730. Such processed signal from the DRx module 300 can then be routed to the ASM through one or more signal paths.

In the example of FIG. 23, a main antenna 720 can be configured to, for example, facilitate transmission of RF signals from the PA module 712. In some embodiments, receive operations can also be achieved through the main antenna.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency module comprising:

a packaging substrate;

a surface acoustic wave device mounted on the packaging substrate, the surface acoustic wave device including a piezoelectric substrate having first and second sides, and interdigital transducers implemented on the first side of the piezoelectric substrate, the surface acoustic wave device oriented so that the first side of the piezoelectric substrate is between the packaging substrate and the second side of the piezoelectric substrate;

a resin layer implemented on the second side of the piezoelectric substrate; and a silicon die having a radio-frequency integrated circuit positioned over the resin layer.

2. The radio-frequency module of claim 1 wherein the surface acoustic wave device is a surface acoustic wave filter.

3. The radio-frequency module of claim 1 wherein the radio-frequency integrated circuit is configured to amplify a signal.

4. The radio-frequency module of claim 3 wherein the radio-frequency integrated circuit includes a low-noise amplifier.

5. The radio-frequency module of claim 1 wherein the radio-frequency module is a global positioning system (GPS) module.

6. The radio-frequency module of claim 1 further comprising an overmold implemented over the packaging substrate to encapsulate a stack assembly that includes the surface acoustic wave device, the resin layer and the silicon die.

7. The radio-frequency module of claim 1 wherein the surface acoustic wave device includes a mounting side configured to allow the mounting of the surface acoustic wave device on the packaging substrate.

8. The radio-frequency module of claim 7 wherein the mounting side of the surface acoustic wave device includes a plurality of solder balls.

9. The radio-frequency module of claim 1 wherein the silicon die is configured to allow formation of a plurality of wirebonds to provide respective electrical connections between the silicon die and the packaging substrate.

10. A method for fabricating a radio-frequency module, the method comprising:

forming or providing a packaging substrate;

mounting a surface acoustic wave device on the packaging substrate, the surface acoustic wave device including a piezoelectric substrate having first and second sides, and interdigital transducers implemented on the first side of the piezoelectric substrate, the surface acoustic wave device oriented so that the first side of the piezoelectric substrate is between the packaging substrate and the second side of the piezoelectric substrate;

forming a resin layer on the second side of the piezoelectric substrate; and mounting a silicon die having a radio-frequency integrated circuit over the resin layer.

11. The method of claim 10 further comprising forming an overmold over the packaging substrate to encapsulate a stack assembly that includes the surface acoustic wave device, the resin layer and the silicon die.

12. The method of claim 11 wherein at least some of the forming or providing of the packaging substrate, the mounting of the surface acoustic wave device, the forming of the resin layer, the mounting of the silicon die, and the forming of the overmold is performed while in a panel format having an array of units, each unit corresponding to a radio-frequency module.

13. An assembly of components for radio-frequency application, comprising:

a surface acoustic wave device having a mounting side, and including a piezoelectric substrate having first side and second sides, and interdigital transducers implemented on the first side of the piezoelectric substrate, the surface acoustic wave device oriented so that the second side of the piezoelectric substrate is opposite from the mounting side of the surface acoustic wave device;

a resin layer implemented on the second side of the piezoelectric substrate; and a silicon die having a radio-frequency integrated circuit, and attached to the second side of the piezoelectric substrate by the resin layer, such that the assembly is capable of being mounted on a circuit board.

14. The assembly of claim 13 wherein the surface acoustic wave device is a surface acoustic wave filter, and the silicon die is a low-noise amplifier die.

15. The assembly of claim 14 wherein the surface acoustic wave filter and the low-noise amplifier die are configured to operate in a range of frequency associated with a global positioning system (GPS).

* * * * *